(12) United States Patent
Nakagawa

(10) Patent No.: US 8,062,774 B2
(45) Date of Patent: Nov. 22, 2011

(54) ORGANIC ELECTROLUMINESCENCE DISPLAY AND METHOD OF PRODUCING SAME

(75) Inventor: Katsumi Nakagawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/729,340

(22) Filed: Mar. 23, 2010

(65) Prior Publication Data

US 2010/0171115 A1    Jul. 8, 2010

Related U.S. Application Data

(62) Division of application No. 11/476,084, filed on Jun. 28, 2006, now Pat. No. 7,790,297.

(30) Foreign Application Priority Data

Jun. 30, 2005  (JP) ................................ 2005-191291

(51) Int. Cl.
*H01L 51/54*       (2006.01)

(52) U.S. Cl. ... 428/690; 257/40; 257/643; 257/E51.006; 257/E51.027; 525/928; 313/504; 313/506; 252/301.16

(58) Field of Classification Search ........................ None
See application file for complete search history.

(56) References Cited

U.S. PATENT DOCUMENTS

| | | | |
|---|---|---|---|
| 6,264,866 B1 | 7/2001 | Yamada et al. | 264/216 |
| 7,109,650 B2 | 9/2006 | Park et al. | 313/504 |
| 2004/0080266 A1* | 4/2004 | Park et al. | 313/509 |
| 2005/0134171 A1 | 6/2005 | Kobayashi | 313/504 |

FOREIGN PATENT DOCUMENTS

| | | |
|---|---|---|
| JP | 2001-196188 | 7/2001 |
| JP | 2002-091343 A | 3/2002 |
| JP | 2004-111361 | 4/2004 |
| JP | 2004-334089 | 11/2004 |

* cited by examiner

*Primary Examiner* — Jennifer A Chriss
*Assistant Examiner* — Michael H Wilson
(74) *Attorney, Agent, or Firm* — Fitzpatrick, Cella, Harper & Scinto

(57) ABSTRACT

There is provided an organic electroluminescence display includes a lower electrode formed on a substrate, a device separation film formed on the lower electrode, an organic compound layer formed on the device separation film and including a light emission layer, and an upper electrode formed on the organic compound layer, wherein the device separation film is a polyimide film having an imidation ratio in a range of 65% or more to less than 90%. The display is expected to have longer operating life.

5 Claims, 5 Drawing Sheets

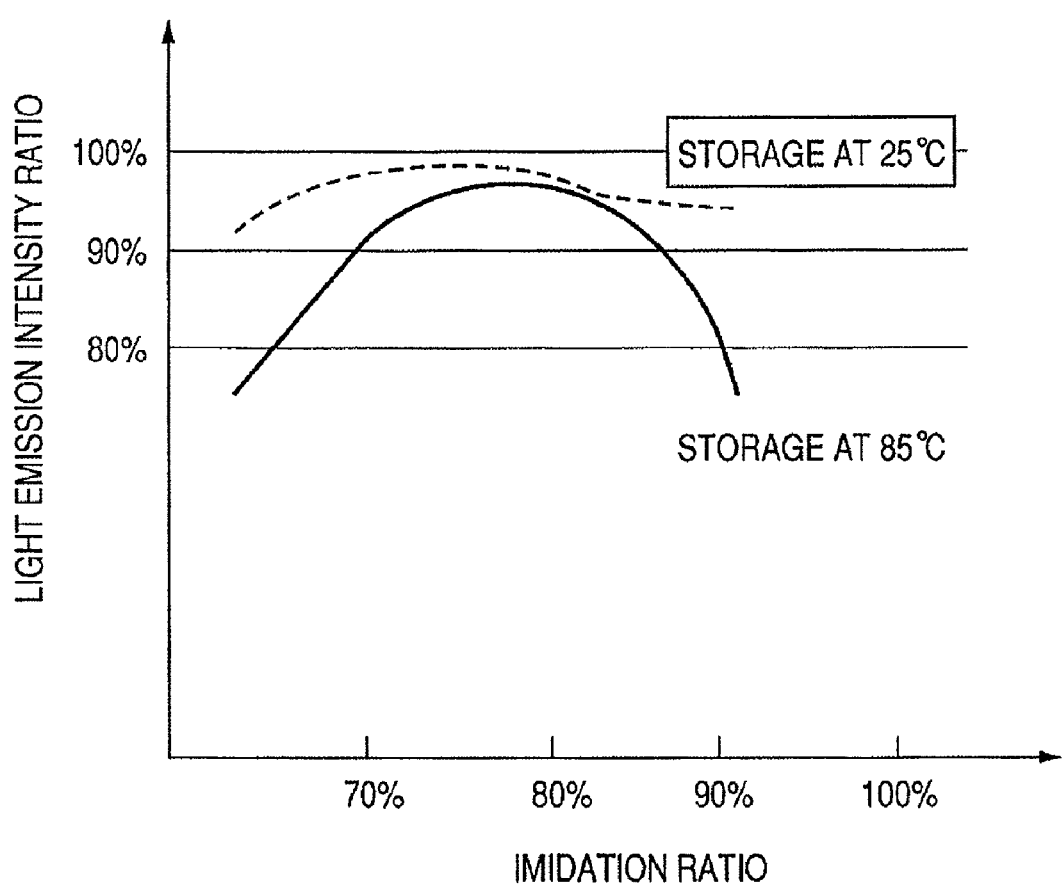

ORGANIC ELECTROLUMINESCENCE DISPLAY AND METHOD OF PRODUCING SAME

BACKGROUND OF THE INVENTION

1. Field of the Invention

The present invention relates to an image display apparatus. More specifically, the present invention relates to an organic electroluminescence display using an organic electroluminescence device.

2. Related Background Art

An organic electroluminescence (hereinafter referred to as EL) device utilizing the EL of an organic material is constituted by interposing an organic compound layer, which is obtained by laminating a light emission layer and a carrier transport layer each composed of an organic molecule, between a lower electrode and an upper electrode. A display using the organic EL device is particularly suitable for displaying a color dynamic image because the display is excellent in color reproducibility, and has good response to an input signal. In addition, the display can be used in a wide variety of environments because the display can emit light at high luminance, and has a wide view angle.

Examples of a material for the organic compound layer include a low-molecular weight material that can be subjected to vacuum deposition and a polymer-based material that qualifies for application by means of a spin coating method or an ink jet method. Although a low-molecular weight material has been used in many cases at present, the number of cases where a polymer-based material suitable for a large-area display is used is expected to increase in the future. Methods of driving the device are classified into a simple matrix type and an active matrix type. In the simple matrix type, the device is composed only of stripe-shaped lower and upper electrodes extending in the directions perpendicular to each other. In the active matrix type, each pixel has a thin film transistor for driving the organic EL device.

An organic EL display has, for example, the following characteristics: a more beautiful screen, faster response, and relatively lower power consumption than those of a liquid crystal display or of a plasma display. At present, however, the organic EL display has been put to practical use only in applications where the display is used in a small screen and is continuously used for a relatively short time period such as: the indicators of various measuring instruments; and the display screens of a portable phone and a digital camera. The main problem to be solved before the organic EL display is used in applications where the display is used in a large screen and is continuously used for a long time period such as the monitors of a television and a computer in the future is a reduction in light emission intensity in association with the long-term, continuous use of the display.

A reduction in light emission intensity often starts from the peripheral portion of a pixel or in a spot fashion, and measures provided by a drive circuit according to a voltage programming mode or current programming mode to be described later do not sufficiently alleviate the reduction. At present, a cause for the phenomenon has not been completely ascertained. However, an organic compound to be used in an EL display is extremely sensitive to moisture. Accordingly, there is no doubt that the reaction of the organic compound itself or of an interface between an organic compound layer and an electrode caused by so trace an amount of moisture that cannot be analyzed is greatly responsible for the deterioration of the properties of the display.

In view of the foregoing, the surface of an organic EL device is generally provided with a protective layer so that the penetration of moisture from the outside of the device is inhibited. It is particularly recommended that a film having a coefficient of water permeability of $10^{-5}$ mg/m$^2$·day or less made of, for example, silicon nitride or polyparaxylene be used. Furthermore, the outermost surface of the device is covered with a cover glass. In addition, even a trace amount of penetrated moisture is adapted to be absorbed by a drying agent such as calcium oxide, calcium chloride, or barium oxide, so the lifetime of an organic EL display is effectively lengthened. Despite such measures as mentioned above, the lifetime of a current organic EL display does not reach the level needed for application to a television, that is, 50,000 hours. Not only an influence of moisture penetrating from the outside of an organic EL display during the use of the display but also an influence of moisture that is absorbed by a film or generated during a production step for the display must be investigated with a view to achieving an additional increase in lifetime of the display.

In a production step for an organic EL display, a planarization film or a device separation film frequently contacts with a developer or cleaning fluid containing moisture before an organic compound layer is formed. Accordingly, each of the films may absorb moisture in it, or may adsorb moisture to its surface. In addition, as described later, a polyimide film may produce moisture in association with a formation reaction for the film. Possible measures to cope with such circumstances include heating and a dehydration treatment in an atmosphere with reduced pressure. However, a heating treatment among others is preferably performed before the formation of the organic compound layer because a material for the organic compound layer decomposes at a temperature in excess of 100° C.

Japanese Patent No. 3531597 describes that moisture incorporated into or adsorbed to an insulating layer (corresponding to a planarization film or a device separation film) constituting an organic EL device diffuses to the entirety of the device in association with the long-term use of the device to cause a reduction in light emission intensity particularly at the peripheral portion of a pixel. The document proposes that the insulating layer is subjected to a dehydration treatment by heating a substrate at 80° C. or higher before the formation of an organic compound layer (thin film layer) or by placing the substrate in an atmosphere with reduced pressure for 10 minutes or longer. The document describes that no significant change in light emission efficiency is observed even after 1 to 3 months from the production of the device owing to the improvement.

However, the inventor of the present invention has found that, in the case where an organic EL display is continuously used over 1 to 3 months, or is stored at a high temperature as about 85° C., a reduction in light emission intensity similar to that in the case of a conventional organic EL display described in Japanese Patent No. 3531597 is observed even when the measures disclosed in Japanese Patent No. 3531597 are taken. Therefore, only the method of Japanese Patent No. 3531597 may not suffice for the dehydration of the insulating layer. When the substrate immediately before the formation of the thin film layer is heated up to a temperature much higher than 80° C. in an atmosphere with reduced pressure, a dehydration effect becomes relatively high. However, the substrate must be prevented from being heated up to a temperature exceeding a certain limit because a large amount of low-molecular weight components may volatilize from the insulating layer in association with the heating, or a strong stress may be generated owing to thermal contraction. In particular, in the case of an active matrix type device, a transistor or a capacitor is present below a planarization film, so excessive heating adversely affects the properties of the device. Heating at about 80° C. for a long time period is not preferable in terms of productivity because the heating causes a reduction in throughput although the heating is somewhat effective.

In view of the foregoing, the inventor of the present invention has conducted detailed investigation into a formation step for a polyimide. It is said that a polyimide has high heat resistance, is stable and absorbs or permits the permeation of a small amount of moisture under appropriate forming conditions for the polyimide; and shows particularly excellent properties when it is used as a device separation film or a planarization film.

An example of the formation of a polyimide film is a reaction involving: synthesizing a polyamic acid that is soluble in an organic solvent by using pyromellitic anhydride (PMDA) and bis(4-aminophenyl)ether (ODA) as starting materials; and imidating the polyamic acid as a precursor through heating to form a polyimide film. The reaction is shown below (Japan Polyimide Research Group, "Latest Polyimide—Basis and Application—", published by NTS, p. 4-5). That is, the polyamic acid dissolved into an organic solvent is applied, and the organic solvent is driven off in a pre-baking step, whereby the film is cured. The polyamic acid shown here has no photosensitivity, so the formation of an opening requires the separate application of a resist and the performance of exposure and development. After the formation of the opening, washing is performed for removing a developer and a residue. Furthermore, post-baking is performed, whereby an amino group and a carboxyl group cause ring closure to form an imide group. Water is produced as a by-product in association with the ring closure.

Chemical Formula 1

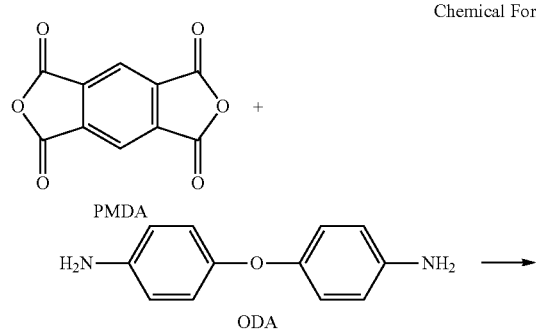

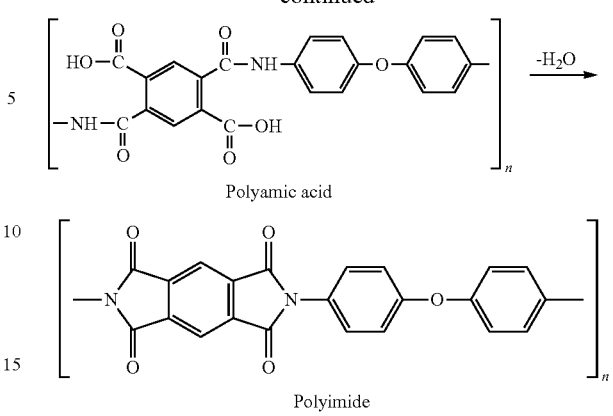

An example of the reaction of a photosensitive polyimide capable of simplifying a formation step for a polyimide film is shown below. In this case, a methacryloyl group having photosensitivity as represented by R in the formula is bound to a carboxyl group of a polyamic acid via an ester, so the polyamic acid becomes insoluble in a developer when it is irradiated with light. Therefore, an unexposed portion is removed after development, whereby an opening is formed. After that, as in the case of the above-described non-photosensitive material, washing and post-baking are performed, whereby an amino group and a carboxyl group cause ring closure to form an imide group (Japan Polyimide Research Group, "Latest Polyimide—Basis and Application—", published by NTS, p. 4-5). In this reaction, alcohol is formed in association with the ring closure. The photosensitive material is of a negative type in which an unexposed portion is removed by development. In contrast, a positive type photosensitive material in which an exposed portion is removed by development is also available (Japanese Patent Application No. 2004-334089), and has been widely adopted in the production of an organic EL display because a taper can be easily formed at an opening portion of a device separation film.

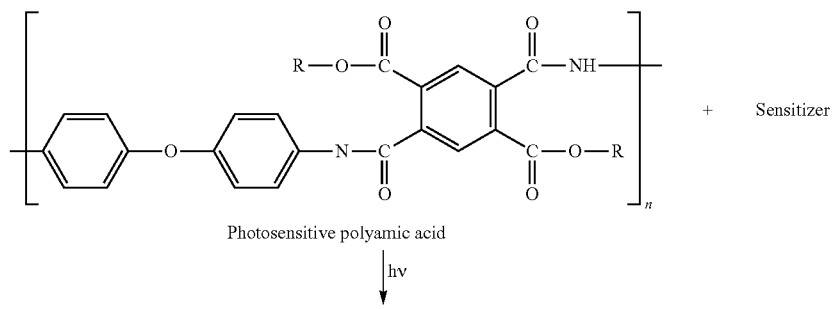

-continued

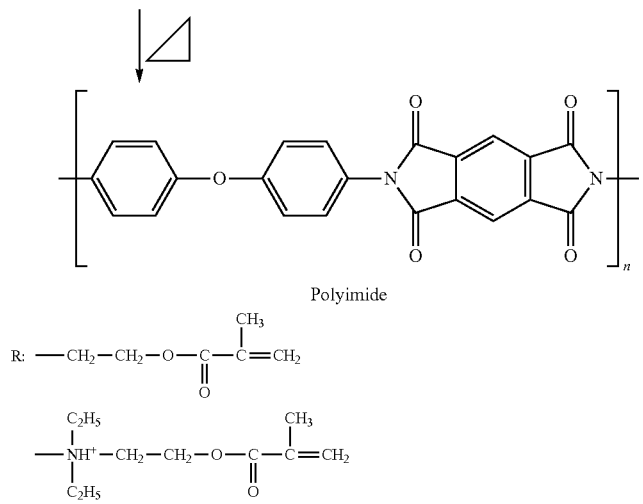

Two concerns can be pointed out here. A first concern is that such non-photosensitive material as represented by Chemical Formula 1 forms water in association with the ring closure of an imide group. A second concern is that a film in an unstable state before the formation of the imide group is quite likely to absorb moisture irrespective of the presence or absence of photosensitivity because the film is caused to contact with a developer or a cleaning fluid in an opening forming step or a washing step for forming an opening. Moisture absorbed by the film is expected to be released by high temperatures in the subsequent post-baking step. On the other hand, the moisture permeability of the film reduces as soon as imidation progresses, so moisture in the film is hardly released. Therefore, the release of moisture in a film may not be considerably expected from the dehydration treatment after post-baking described in Japanese Patent No. 3531597 although the treatment is effective in removing moisture adsorbed to the surface of the film.

As described above, minimizing the amount of moisture finally remaining in a planarization film or in a device separation film is extremely important to put an organic EL display to practical use. However, it is difficult to quantitatively analyze an extremely trace amount of moisture that may affect the properties of an organic EL device.

In view of the foregoing, the inventor of the present invention has made attempts to indirectly determine as to what kind of state of a polyimide film has a small amount of remaining moisture. Japanese Patent Application No. 2004-111361 describes a reference for determining. That is, Japanese Patent Application No. 2004-111361 focuses on an imidation ratio as a criterion for determination as to whether a formed polyimide film is good or bad when the polyimide film is used as an insulating layer of an organic EL device, and describes that an imidation ratio in excess of 95% is preferable. However, the document has no description concerning how the imidation ratio is related to the lifetime of the organic EL device or to the amount of moisture remaining in the insulating layer. Furthermore, the document has no description concerning how the film is evaluated for imidation ratio, so the document provides no specific clue to determine.

SUMMARY OF THE INVENTION

The present invention has been made in view of such circumstances, and an object of the present invention is to prolong the lifetime of an organic EL display having a polyimide film.

An organic EL display of the present invention includes: a lower electrode formed on a substrate; a device separation film formed on the lower electrode; an organic compound layer formed on the device separation film and including a light emission layer; and an upper electrode formed on the organic compound layer, in which the device separation film includes a polyimide film having an imidation ratio in a range of 65% or more to less than 90%.

Another organic EL display of the present invention includes: a drive circuit formed on a substrate; a planarization film formed on the drive circuit; a lower electrode formed on the planarization film; a device separation film formed on the lower electrode; an organic compound layer formed on the device separation film and including a light emission layer; and an upper electrode formed on the organic compound layer, in which at least one of the planarization film and the device separation film includes a polyimide film having an imidation ratio in a range of 65% or more to less than 90%.

A method of producing an organic EL display of the present invention includes the steps of: forming a lower electrode on a substrate; forming a device separation film on the lower electrode; forming an organic compound layer including a light emission layer on the device separation film; and forming an upper electrode on the organic compound layer, in which the step of forming a device separation film includes applying a polyimide precursor solution mainly composed of a polyamic acid, pre-baking the applied solution to form a polyimide precursor film, and post-baking the polyimide precursor film to form a polyimide film; a rate of temperature increase up to a pre-baking maximum ultimate temperature is 8° C./min or less; and a post-baking maximum ultimate temperature is in a range of a glass transition temperature of the polyimide film or more to less than +40° C. of the glass transition temperature.

Another method of producing an organic EL display includes the steps of: forming a drive circuit on a substrate; forming a planarization film on the drive circuit; forming a lower electrode on the planarization film; forming a device separation film on the lower electrode; forming an organic compound layer including a light emission layer on the device separation film; and forming an upper electrode on the organic compound layer, in which at least one of the step of forming a planarization film and the step of forming a device separation film includes applying a polyimide precursor solution mainly composed of a polyamic acid, pre-baking the applied solution to form a polyimide precursor film, and post-baking the polyimide precursor film to form a polyimide film; in which a rate of temperature increase up to a pre-baking maximum ultimate temperature is 8° C./min or less; and a post-baking maximum ultimate temperature is in a range of a glass transition temperature of the polyimide film or more to less than +40° C. of the glass transition temperature.

According to the present invention, the amount of moisture remaining in a planarization film or device separation film mainly composed of a polyimide can be suppressed, so an organic EL display that shows an extremely small reduction in light emission intensity even when the display is stored at a high temperature for a long time period, or is continuously used at room temperature can be obtained.

In addition, the present invention is easily applicable to the mass production of an organic EL display because the present invention does not include a complicated step or a step requiring a special facility.

In addition, according to the present invention, an improving effect on the lifetime of an organic EL display can be determined immediately after the formation of a film, so the present invention is expected to contribute to an improvement in efficiency of the development of the organic EL display.

BRIEF DESCRIPTION OF THE DRAWINGS

FIG. 5 is a view showing a relationship between the ratio of light emission intensity after 3 months storage of an organic EL display to initial light emission intensity and the imidation ratio of a device separation film.

DESCRIPTION OF THE PREFERRED EMBODIMENTS

Figure 1A:
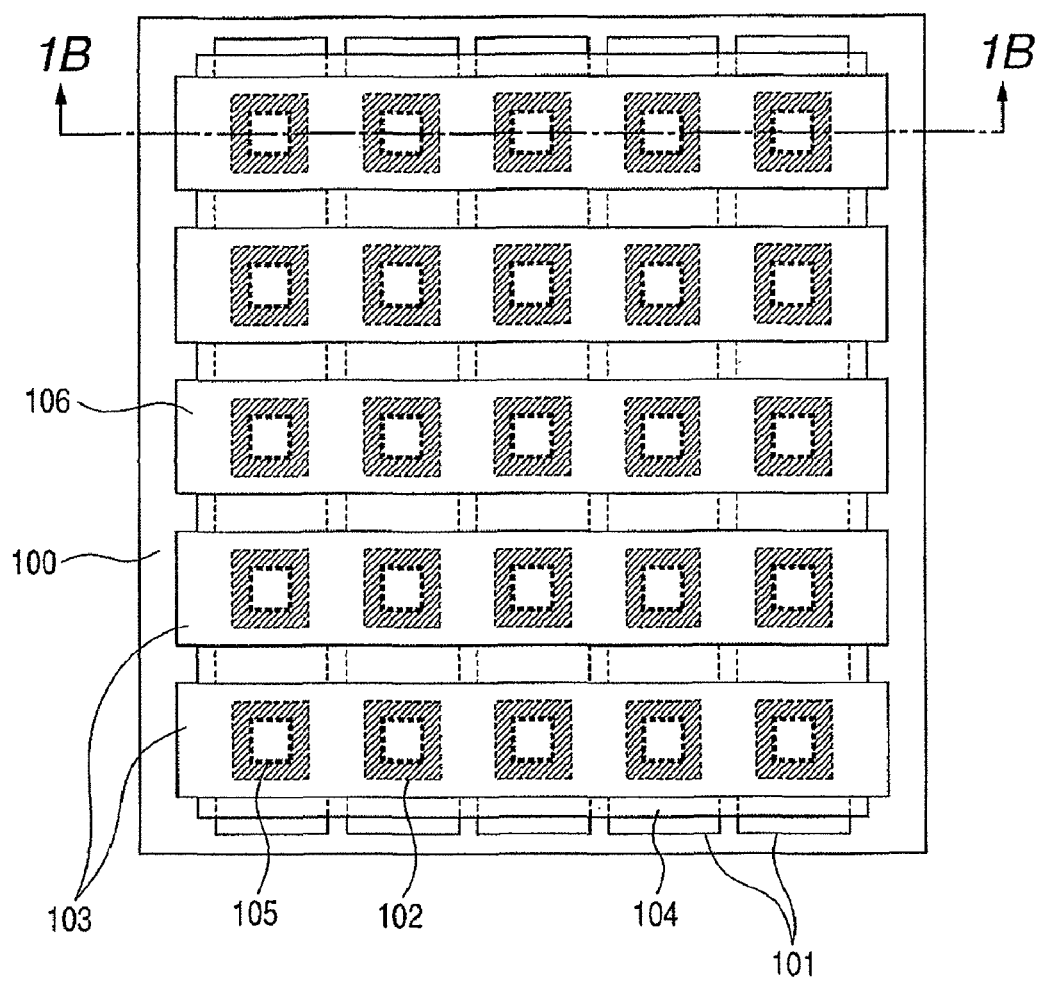
FIGS. 1A and 1B are views each showing an example of a simple matrix type organic EL display.

A simple matrix type organic EL display was prototyped for investigating a correlation between a condition for forming a polyimide film and the light emission intensity of an organic EL display.

First, an ITO film was deposited onto the surface of a no-alkali glass substrate by means of a sputtering method, and was patterned into a stripe shape by means of a general photolithography method, whereby a lower electrode was formed.

A solution of a precursor (polyamic acid) for a positive type photosensitive polyimide ("PHOTONEECE DL-1000", manufactured by Toray Industries, Inc.) was applied to the surface of the lower electrode by means of spin coating. The substrate was mounted on a hot plate capable of accurately controlling the surface temperature, and was heated up to 120° C. at a predetermined rate of temperature increase (Rpre). The temperature was held for 2 minutes, thus pre-baking was finished. Thus, the applied film was cured. Rpre was changed in the range of from 2° C./min to 100° C./min in five levels. Next, the cured polyimide precursor film was exposed to light having a predetermined pattern, and the resultant was then developed with an aqueous solution of an organic alkali. As a result, an exposed portion was dissolved, and an opening was formed. After that, the resultant was washed with pure water while being stirred for removing the developer and the residue. After that, a predetermined temperature (Tpost) was held, and the resultant was post-baked, whereby a device separation film was formed. Tpost was changed in the range of from 200° C. to 280° C. in five levels. Conditions for Tpost were combined with conditions for Rpre in a matrix manner to set a total of 25 conditions, and two identical substrates were produced for each condition. Next, all the substrates were heated in dry air to 80° C., and were then placed in an atmosphere with a pressure reduced to 10 Pa for 30 minutes, followed by a dehydration treatment.

After each of those substrates has been subjected to the dehydration treatment, each of those substrates was covered with a metal mask for specifying a deposition region sequentially, and was transferred to a vacuum deposition system. After the pressure in the system had been reduced to $2 \times 10^{-4}$ Pa, copper phthalocyanine having a thickness of 15 nm and bis(N-ethylcarbazole) having a thickness of 60 nm were deposited from the vapor to serve as a hole transport layer (not shown). Next, 4,4'-bis(2,2'-diphenylvinyl)diphenyl (DPVBi) having a thickness of 20 nm was deposited from the vapor to serve as a blue light emission layer (not shown). Next, DPVBi having a thickness of 35 nm and an aluminum quinolinol complex ($Alq_3$) having a thickness of 10 nm were deposited from the vapor to serve as an electron transport layer (not shown). Finally, the surface of each of the substrates was doped by being exposed to gaseous lithium, whereby an organic compound layer composed of the hole transport layer, the light emission layer, and the electron transport layer was formed.

Subsequently, a metal mask having a stripe-shaped opening was brought into contact with the surface of each of the substrates while the substrates were not exposed to the atmosphere, and then aluminum having a thickness of 400 nm was vapor-deposited. Thus, an upper electrode extending in the direction perpendicular to the lower electrode was formed. Furthermore, the lower electrode was connected to a column drive circuit, and the upper electrode was connected to a row drive circuit. After that, the entire surface of each of the substrates was covered with an aluminum cap, and the inside of the resultant was filled with an argon gas having a dew point of −100° C. or lower. Then, a thermosetting epoxy resin was stuck to the periphery of the resultant for sealing.

Subsequently, all displays were driven at room temperature under a maximum settable luminance condition (an initial luminance of 200 cd/m$^2$), and the intensity (flux) of light emitted to a substrate side was measured for each pixel. After that, a first display under each production condition was stored at room temperature (corresponding to a temperature of 25° C. and a relative humidity of 50%), and a second display under the production condition was stored at a high temperature (in an environmental test chamber having a temperature of 85° C. and a relative humidity of 50%). After the lapse of 3 months, each display was driven at room temperature under a condition identical to that before the storage, and the light emission intensity of a pixel was measured again. And a ratio of the light emission intensity after the storage to an initial light emission intensity was calculated. That is, the lower ratio of the light emission intensity, the larger deterioration.

The following tendencies are generally observed.

1) For all conditions for forming a device separation film (polyimide film), a display stored at a high temperature has a light emission intensity ratio smaller than that of a display stored at room temperature. In a display having a small light emission intensity ratio, a reduction in light emission intensity is remarkable particularly at the peripheral portion of a pixel in many cases.
2) A display stored at a high temperature has the optimum range of Tpost where a light emission intensity ratio approaches 100%. Tpost of the display stored at a high temperature above or below the range results in a reduction in light emission intensity ratio. The optimum range tends to depend on Rpre.

Each display was sealed, and was stored at a low relative humidity. Accordingly, the deterioration of the display is expected to be influenced not by the penetration of moisture from the outside of the display but by moisture remaining inside the display. The deterioration is expected to be influenced also by a variation in amount of moisture remaining in a device separation film because the deterioration depends on the conditions for forming the device separation film.

Each display stored at a high temperature was evaluated for imidation ratio of its device separation film in order to obtain a clue to improvement. The aluminum cap for sealing was removed, and the device separation film was collected while being observed with a microscope. The film was mounted on a KBr crystal support plate, and the infrared absorption spectrum of the film was measured by using a microscopic infrared spectroscopic analyzer. Table 1 shows examples of an infrared absorption peak concerning an imide group and a reference peak.

TABLE 1

| Attribution of absorption peak | Position of absorption peak ($cm^{-1}$) |
|---|---|
| A) C=C longitudinal vibration of aromatic group | 1510 |
| B) C=O longitudinal vibration of imide group | 1724 |
| C) C—N—C longitudinal vibration of imide group | 1375 |
| D) C=C longitudinal vibration of imide group | 1780 |

A peak A is used as a reference peak because it is attributed to a bond not involved in the formation of an imide group, and maintains a constant intensity irrespective of the degree of imidation. Peaks B to D each depend on the concentration of a formed imide group. In actuality, none of the peaks B to D is observed before post-baking. Therefore, normalizing the intensity of each of the peaks B to D by the intensity of the peak A can offset an error due to, for example, a fluctuation in thickness of a sample. When Tpost is sufficiently increased, the normalized intensity of each of the peaks B to D saturates at a constant value, so imidation is considered to be complete. In view of the foregoing, the "imidation ratio" of a polyimide film formed under a certain Rpre or Tpost condition is defined as represented by the following expression (1).

Imidation ratio=(Intensity of peak X under this condition/Intensity of peak A under this condition)/(Intensity of peak X under saturation condition/Intensity of peak A under saturation condition) (1)

X represents any one of B to D. It has been confirmed that the use of any one of the peaks B to D provides a substantially equal imidation ratio.

The imidation ratio of a device separation film formed under each condition was determined. As a result, such correlation as shown in FIG. 5 was found between the imidation ratio and a ratio of the light emission intensity of a display using the device separation film after storage, before the storage. That is, a display stored at room temperature has a light emission intensity ratio of 90% or more under all conditions. Meanwhile, the light emission intensity ratio of a display stored at a high temperature tends to reduce when an imidation ratio is 90% or more.

To be specific, 3) a light emission intensity ratio of 80% can be maintained when an imidation ratio is in the range of 65% or more to less than 90%. As long as a light emission intensity ratio of 80% or more can be maintained, no reduction in light emission intensity can be visually observed, and at least a single color can be displayed without any troubles in the practical use of a display. However, even when the light emission intensity ratio is in the range, in the case where colors in color display largely differ from each other in light emission intensity ratio, a change in tint may be felt. Furthermore, 4) a light emission intensity ratio of 90% can be maintained when an imidation ratio is in the range of 70% or more to less than 85%. As long as a light emission intensity ratio of 90% or more can be maintained, even color display can be performed without any troubles in the practical use of a display.

When a display is stored at a temperature of 85° C. or less, or different material for an organic compound is used, the absolute value of a light emission intensity ratio may vary. However, the conditions shown in 3) and 4) can be regarded as conditions for obtaining a polyimide film having a small amount of remaining moisture, and can be easily measured, so they can be general, promising guidelines for the obtainment of an organic EL display showing no reduction in light emission intensity. Furthermore, even when an ambient temperature is room temperature, in the case where a display is continuously used under a high luminance condition, the temperature of: an organic compound of a panel; or a portion where wiring is concentrated may locally increase. Therefore, the range of an imidation ratio shown in each of 3) and 4) is considered to be a criterion to be satisfied by an organic EL display that is assumed to be continuously used for a long time period.

Additional analysis of data has shown that the formation of a polyimide under conditions obtained by combining conditions shown in 5) and 6) below is suitable for obtaining an imidation ratio in the range.

First, Tpost is in the range of preferably 200° C. or more to less than 240° C., or more preferably 210° C. or more to less than 230° C. Additional investigation into various kinds of polyimides shows that an indication of the progress of imidation is generally given by a difference between Tpost and the glass transition temperature (Tglass) of a polyimide film. For example, when Tpost is lower than Tglass, the progress of imidation is significantly retarded. In addition, Tglass of the polyimide film used in this experiment was 200° C. Accordingly, a general condition is as described below.

5) Tpost is in the range of preferably Tglass or more to less than (Tglass+40° C.), or more preferably (Tglass+10° C.) or more to less than (Tglass+30° C.).

Furthermore,

6) Rpre is preferably 8° C./min or less, or more preferably 4° C./min or less.

A tendency is observed, in which, when Rpre is smaller, a higher imidation ratio is obtained even in the case where Tpost is kept the same. As a result, the adjustable range of the imidation ratio expands.

The inventor of the present invention considers the mechanism via which the tendency shown in 5) is observed to be as described below.

Imidation is completed in a short time period in a film having an extremely high imidation ratio because Tpost is high. The moisture permeability of the film reduces immediately after the initiation of post-baking. Therefore, moisture in the film cannot be completely released within a practically allowable time for post-baking, and remains. Remaining moisture gradually diffuses to an organic compound layer during long-term and high-temperature storage to deteriorate the properties of the layer. On the other hand, when an imidation ratio is extremely low, imidation that has insufficiently progressed in post-baking gradually progresses later in association with high-temperature storage, and moisture, alcohol, or the like to be produced in association with the progress acts on an organic compound layer to reduce a light emission intensity.

The inventor considers the mechanism via which the tendency shown in 6) is observed to be as described below.

A solvent in an applied precursor evaporates and disappears during pre-baking. At that time, the skeleton of a polyamic acid is aligned, so a film pre-baked for a long time period (at low Rpre) is brought into a state where imidation easily progresses upon post-baking. 6) is expected to be an effective guideline even for a general polyimide.

An organic EL display emitting green light was prototyped in the same manner as that described above except that $Alq_3$ doped with 0.3 wt % of 1,3,5,7,8-pentamethyl-4,4-difluoro-4-bora-3a,4a-diaza-s-indacene (PM546) and having a thickness of 21 nm was deposited from the vapor to serve as a light emission layer.

Furthermore, an organic EL display emitting red light was prototyped in the same manner as that described above except that $Alq_3$ doped with 1 wt % of 4-(dicyanomethylene)-2-methyl-6-(julolidylstyryl)pyrane (DCJT) and having a thickness of 15 nm was deposited from the vapor to serve as a light emission layer. A device separation film composed of a polyimide film satisfying the conditions shown in 3) and 4) was used in each of the organic EL displays. As a result, the same degree of suppression of a reduction in light emission intensity in high-temperature storage as that in the case of a blue color was attained. It has been found that a color, organic EL display rich in durability can be produced by combining those displays.

An organic EL display of the present invention has at least: a lower electrode formed on a substrate; a device separation film formed on the lower electrode; an organic compound layer formed on the device separation film and including a light emission layer; and an upper electrode formed on the organic compound layer. In addition, the device separation film preferably has an opening, and the organic compound layer is preferably formed to cover the opening of the device separation film.

Figure 1B:
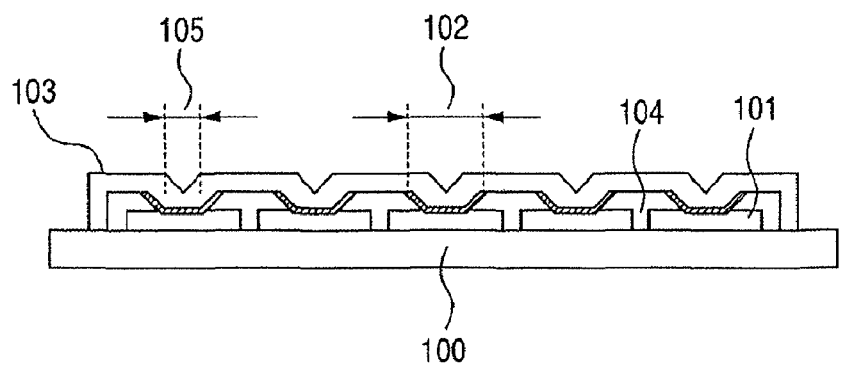

FIGS. 1A and 1B each show a schematic view of a simple matrix type organic EL display as an example of the organic EL display of the present invention. FIG. 1A is a plan view and FIG. 1B is a sectional view along the line 1B-1B of FIG. 1A.

A substrate 100 is composed of, for example, a glass plate, a transparent quartz plate, a ceramic plate, or a plastic film. Lower electrodes 101 are each of a stripe shape extending in a longitudinal (column) direction.

A device separation film 104 is an insulating film having openings 105 provided for respective pixels. In the present invention, the insulating film is a polyimide film having an imidation ratio defined by the expression (1) in the range of 65% or more to less than 90%, or preferably 70% or more to less than 85%, or is preferably a polyimide film formed by imidating a polyimide precursor film mainly composed of a polyamic acid. The device separation film 104 serves to maintain insulating property between each lower electrode 101 and each upper electrode 103. When a low-molecular weight organic compound layer is vapor-deposited from, the film 104 serves as a spacer for preventing a metal mask to be used for the deposition from contacting with each lower electrode 101 to damage the electrode. When a polymer organic compound layer is formed according to an ink jet mode, the film 104 serves as a bank for receiving ink. In each case, the film 104 is required to have a thickness of preferably 0.1 µm or more, or more preferably 0.5 µm or more. When the thickness is larger than 0.5 µm, it becomes difficult to release moisture particularly during post-baking, so the present invention is particularly suitably applicable.

Organic compound layers 102 are formed to cover the openings 105 completely, and prevent a short circuit between each lower electrode 101 and each upper electrode 103. In addition, the light emission region of an individual pixel can be precisely specified because a current flows only in each opening 105.

Each organic compound layer 102 is constituted by an electron transport layer, a light emission layer, a hole transport layer (each not shown), and the like. Examples of a material for the hole transport layer include TPD, α-NPD, and TPTR. Examples of a material for the electron transport layer include $Alq_3$, BCP, and tBu-PBD. $Alq_3$, $BeBq_2$, Almq, or the like added with a guest material such as a coumarin derivative, DCDM, quinacridone, or rubrene is used in the light emission layer, and a full color is realized by separately applying the light emission layer for each monocolor (blue, green, or red) or for each pixel. A phosphorescent material such as $Btp_2Ir(acac)$ or $Ir(ppy)_3$ from which a dramatic increase in light emission efficiency can be expected may also be used. The upper electrodes 103 are formed on the organic compound layers 102 so that each of the electrodes is of a stripe shape extending in a lateral (row) direction.

Each of the stripes of the lower electrodes 101 is connected to a column drive circuit (not shown) for displaying an image. Each of the stripes of the upper electrodes 103 is connected to a row drive circuit (not shown), and a voltage is applied between a specific upper electrode stripe (for example, 106) and each of the stripes of the lower electrodes to flow a predetermined current. At that time, the organic compound layer 102 placed at an intersection point of the upper electrode stripe 106 and each of the stripes of the lower electrodes emits light having an intensity in accordance with the flowed current. The stripes of the upper electrodes 103 are sequentially selected, and a predetermined current is flowed to each of the stripes of the lower electrodes 101 every selection, whereby an image can be displayed.

Light emitted from each organic compound layer 102 can be taken to the front surface side of the substrate 100 by using a transparent conductor as each upper electrode 103. When the substrate 100 to be used is transparent, and a transparent conductor is used as each lower electrode 101, light emitted from each organic compound layer 102 can be taken to the rear surface side of the substrate 100. The former approach to taking light is referred to as a top emission mode, and the latter approach to taking light is referred to as a bottom emission mode. Examples of a transparent conductor that can be used include indium tin oxide (ITO), indium zinc oxide (IZO), and zinc oxide (ZnO).

Another organic EL display of the present invention has at least: a drive circuit formed on a substrate; a planarization film formed on the drive circuit; a lower electrode formed on the planarization film; a device separation film formed on the lower electrode; an organic compound layer formed on the device separation film and including a light emission layer; and an upper electrode formed on the organic compound layer. On the condition that the constitution is established, the planarization film preferably has an opening, the lower electrode is preferably formed to cover the opening of the planarization film, the device separation film preferably has an opening, and the organic compound layer is preferably formed to cover the opening of the device separation film.

Figure 2:
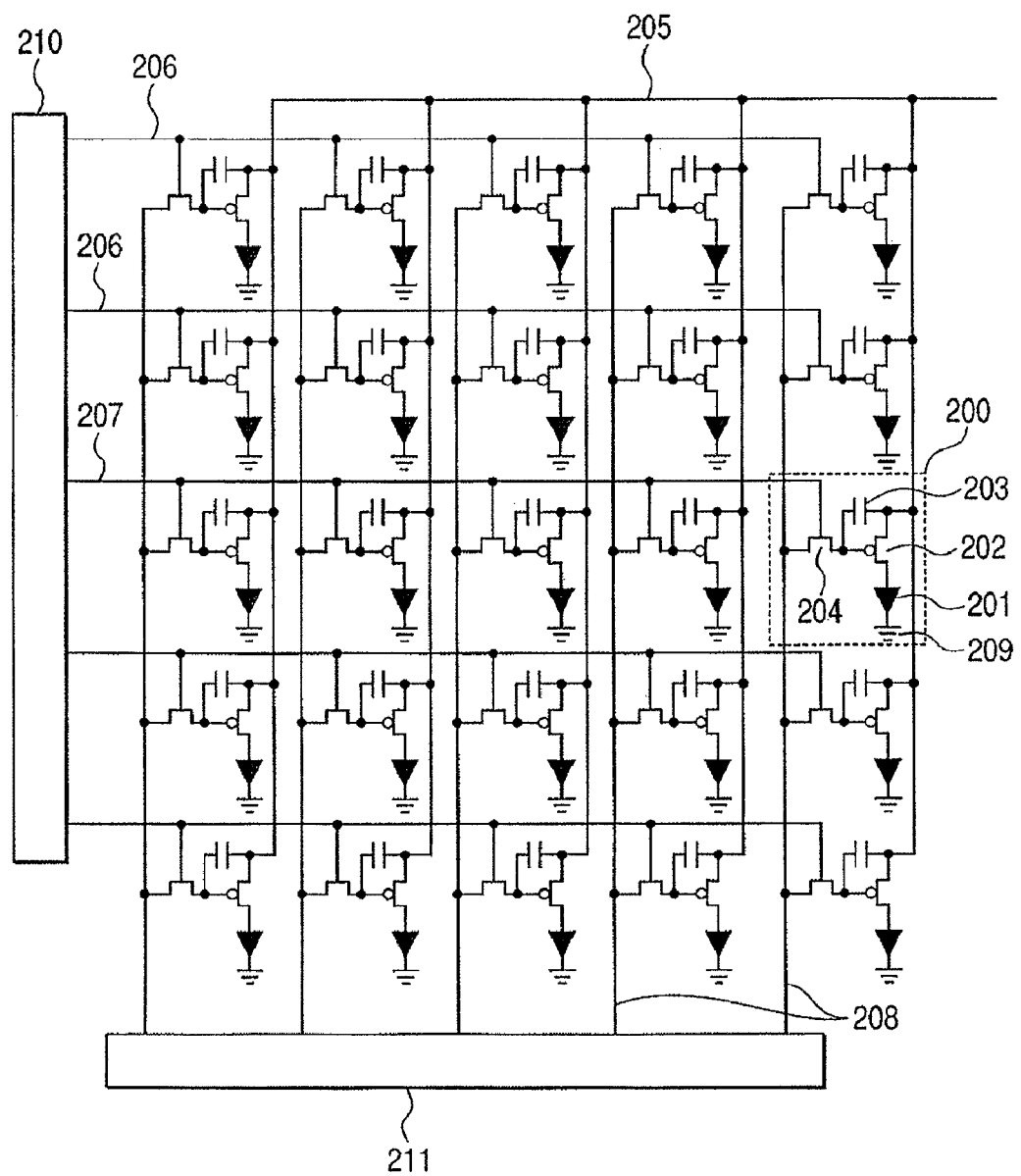
FIG. 2 is a circuit diagram showing an example of an active matrix type organic EL display.
Figure 3:
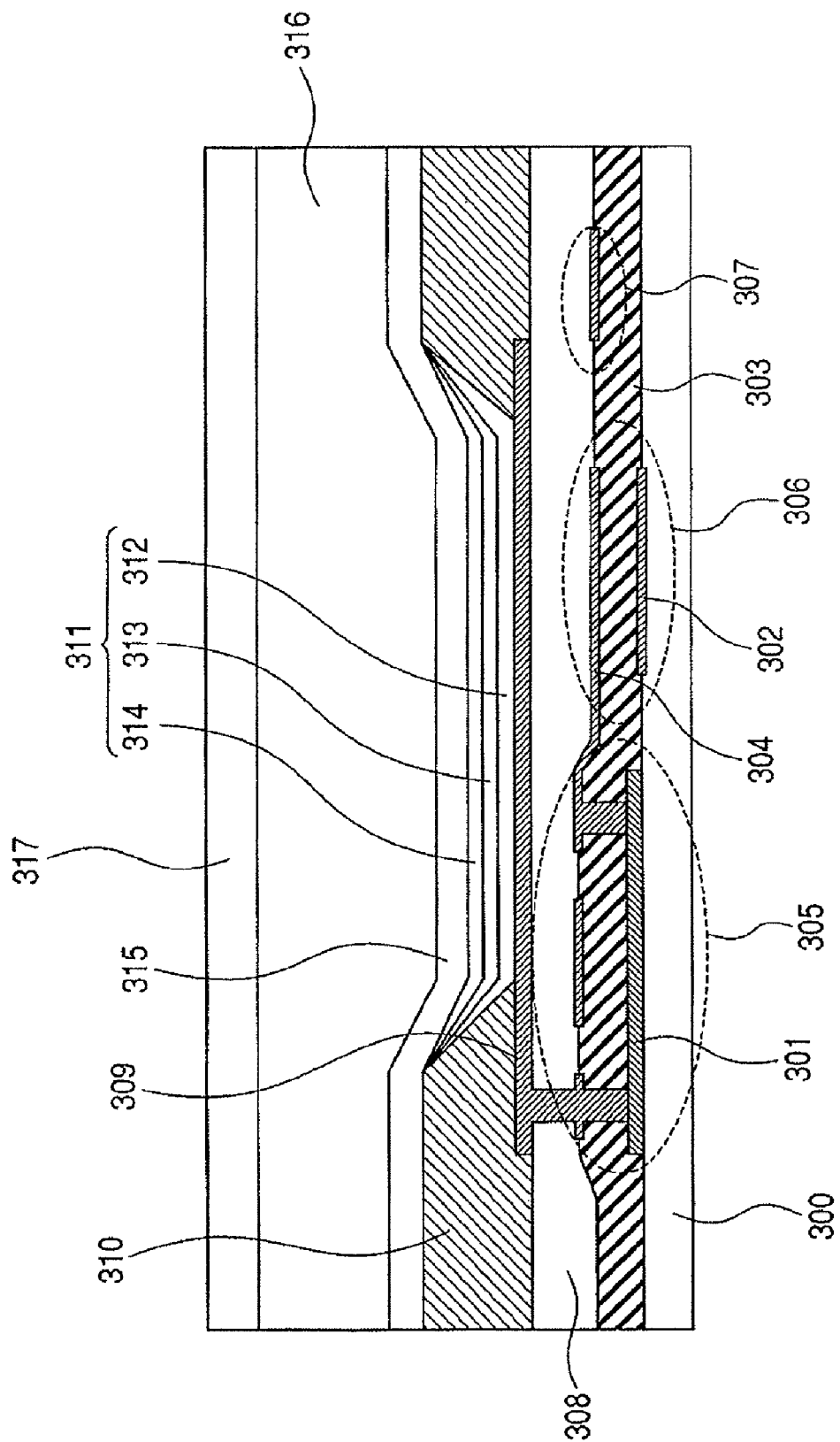
FIG. 3 is a sectional view showing an example of the active matrix type organic EL display.

FIGS. 2 and 3 each show a schematic view of an active matrix type organic EL display as an example of the other organic EL display of the present invention. FIG. 2 is a circuit diagram, and FIG. 3 is a sectional view.

Here, a current flowing in an organic EL device 201 in a pixel 200 is controlled by a circuit in the pixel 200. That is, a current flows from a power source line 205 to the organic EL device 201 via a drive transistor 202. The magnitude of the current is controlled depending on the electric potential of the gate electrode of the drive transistor 202. When a pulse voltage is applied to a scanning line 207 selected from scanning lines 206, a switching transistor the gate electrode of which is connected to the scanning line 207 out of switching transistors 204 is turned on. Thus, a signal voltage individually applied from a signal circuit 211 to each signal line 208 is written in a capacitor 203. A current flowing in the drive transistor 202, that is, a current flowing in the organic EL device 201 is controlled depending on the magnitude of the voltage. When a next scanning line is selected by an action of a scanning circuit 210, the scanning line 207 is brought into a non-selective state, and the electric potential of the capacitor 203 is held until the scanning line 207 is selected again. Thus, the organic EL device 201 continues to emit light having a predetermined intensity. Therefore, an average current to be flowed to the organic EL device 201 may be small as compared to that in the case of a simple matrix type, and the deterioration of the properties of the organic EL device can be suppressed. Accordingly, an active matrix type is particularly advantageous of a large-screen, high-definition display having a large number of pixels. Reference numeral 209 denotes a common electrode.

As shown in FIG. 3, a semiconductor layer 301 to function as a drive transistor or as a switching transistor is formed on a predetermined region of a substrate 300. Amorphous silicon, polysilicon, zinc oxide, indium gallium zinc oxide, an organic semiconductor typified by pentacene or polythiophene, or the like is used as the semiconductor layer 301. A first metal layer 302 formed of aluminum, copper, titanium, or the like is formed on another region on the substrate 300. An insulating layer 303 composed of silicon oxide, silicon nitride, tantalum oxide, hafnium oxide, yttrium oxide, or the like is formed on the semiconductor layer 301 and the first metal layer 302. A second metal layer 304 formed of aluminum, copper, titanium, or the like is formed on a predetermined region on the layer 303. An opening is formed in the insulating layer in a predetermined region between the first metal layer 302 or the semiconductor layer 301 and the second metal layer 304 so that conduction is established, whereby an organic EL device is driven. Thus, a circuit device or wiring typified by each drive transistor 202 or 305, each switching transistor 204, each capacitor 203 or 306, or each scanning line 206 or 307 shown in each of FIGS. 2 and 3 is constituted.

In order that the surface of the resultant may have insulating property, or irregularities produced on the surface of the insulating layer 303 or of the second metal layer 304 by a circuit device, wiring, or opening may be planarized, a planarization film 308 having a thickness of about 0.1 to 4 µm is formed before the organic EL device 201 is formed. Examples of a material that can be used in the planarization film 308 include: inorganic substances such as a silicon oxide film and a silicon nitride film; and various polymers such as polyvinyl-based, polyimide-based, polystyrene-based, novolac-based, silicone-based, acrylic, and epoxy-based polymers. Suitable flatness can be obtained by: applying a liquid polymer precursor to a surface; and then curing the applied precursor through a reaction such as polymerization or condensation. The use of a precursor having a low viscosity provides particularly good flatness. A lamination film of an inorganic film and a polymer can also be used.

A lower electrode 309 of the organic EL device is formed on a predetermined region on the planarization film 308, and is formed of the same metal material (in the case of a top emission mode) or transparent conductive material (in the case of a bottom emission mode) as that of the first metal layer 302. The lower electrode 309 may be a lamination film of a metal film and a transparent conductive film (in the case of a top emission mode). Conduction is established between the lower electrode 309 through a circuit formed below the planarization film 308 and an opening of the planarization film 308. The opening of the planarization film 308 can be formed by: applying a resist to the planarization film 308; and performing etching via an opening of a resist film formed through exposure and development. However, a polymer which itself has photosensitivity has been developed, so the use of such polymer can omit a step such as resist application to improve productivity.

As in the case of a simple matrix type, a device separation film 310 having an opening is formed on the resultant. As in the case of the planarization film 308, an inorganic substance such as a silicon oxide film or a silicon nitride film can be used as a material for the device separation film; provided that a polymer such as a polyvinyl-based, polyimide-based, polystyrene-based, novolac-based, silicone-based, acrylic, or epoxy-based polymer is suitably used. The thickness of the device separation film is at least 0.1 µm or more, or is preferably 0.5 µm or more. The use of a polymer having photosensitivity is particularly advantageous of productivity because an opening must be formed even in the case of the device separation film 310.

In the present invention, at least one of the planarization film 308 and the device separation film 310 is such polyimide film as described below. That is, at least one of them is a polyimide film having an imidation ratio defined by the expression (1) in the range of 65% or more to less than 90%, or preferably 70% or more to less than 85%, or is preferably a polyimide film formed by imidating a polyimide precursor film mainly composed of a polyamic acid. When the thickness of the polyimide film is larger than 0.5 µm as in the case of the foregoing, it becomes difficult to release moisture particularly during post-baking, so the present invention is particularly suitably applicable.

In particular, when complete flatness is needed, each of materials except a polyimide such as an acrylic resin is preferably used as the planarization film 308. However, acrylic resin often has relatively low heat resistance. Therefore, when a polyimide film is used as the device separation film 310, moisture or a low-molecular weight component volatilizes during the post-baking of the film, so damage such as the generation of an air bubble between the planarization film 308 and the device separation film 310 may occur. An indication of the heat resistance of a polymer is given by the glass transition temperature of the polymer. Accordingly, when the glass transition temperature of the device separation film 310 is higher than that of the planarization film 308, Tpost must be decided in narrower temperature range. The present invention is particularly suitably applicable under such constraint.

An organic compound layer 311 is formed to cover the opening of the device separation film 310 completely. The organic compound layer 311 is composed of a hole transport layer 312 having a thickness of about 10 to 100 nm, a light emission layer 313 having a thickness of about 10 to 100 nm, and an electron transport layer 314 having a thickness of about 5 to 50 nm. The order in which those layers are laminated may be opposite to that mentioned above depending on the constitution of a drive circuit. Alternatively, commonality may be achieved between the hole transport layer 312 and the light emission layer 313, or may be achieved between the electron transport layer 314 and the light emission layer 313. Furthermore, a hole injection layer (not shown) may be inserted into a gap between the lower electrode 309 and the hole transport layer 312, or an electron injection layer (not shown) may be placed on the electron transport layer 314. In some cases, a hole block layer or electron block layer (not shown) is provided to be adjacent to the light emission layer 313 to optimize a balance between an electron and a hole in the light emission layer 313, whereby a light emission efficiency can be increased.

A transparent conductive material may be used in an upper electrode 315 to be formed on the resultant, or a metal material may be used in the electrode. In the case of a top emission mode, a transparent conductive material is used, or a thin metal layer is used so that the electrode serves as a semitransparent electrode. In addition, the upper electrode 315 is often used as the common electrode 209 like FIG. 2. In those cases, no formation of a pattern is needed; provided that conductivity that cannot be sufficiently provided only by a transparent conductive material may be compensated by connecting the electrode to metal wiring separately formed on a lower layer through an opening in a region where the organic compound layer 311 is not formed.

A protective layer 316 is provided onto the upper electrode 315, and the resultant is covered with a cover glass 317. A space between the upper electrode 315 and the cover glass 317 may be completely filled with the protective layer 316 as shown in FIG. 3. Alternatively, the space between the upper electrode 315 and the cover glass 317 may be filled with the layer 316 with a gap remaining in the space, and the gap may be filled with dry air. An inorganic film such as a silicon oxide film or a silicon nitride film can be used as a material for the protective layer; provided that a polymer such as a polyvinyl-based, silicone-based, acrylic, or epoxy-based polymer is suitably used for filling the space. The protective layer 316 may be constituted by two layers. In the case of a bottom emission mode, the resultant may be covered with a metal cover instead of the cover glass 317, and its peripheral portion may be sealed with a resin.

A driving mode referred to as a voltage programming mode or a current programming mode is an improved active matrix type. In a circuit according to each of those modes, the deterioration of the properties of an organic EL device, or an influence of the nonuniformity of the properties of a drive transistor can be suppressed within a certain range, but not completely. Adopting each of those modes requires the use of about four transistors per one pixel, resulting in a complicated circuit. However, a sectional structure above the planarization film 308 is the same as that of FIG. 3, and the present invention is suitably applicable to an organic EL display having a drive circuit according to the voltage programming mode or the current programming mode similarly.

Next, a production method of the present invention will be described.

The production method of the present invention includes the steps of: forming a lower electrode on a substrate; forming a device separation film on the lower electrode; forming an organic compound layer including a light emission layer on the device separation film; and forming an upper electrode on the organic compound layer.

Another production method of the present invention includes the steps of: forming a drive circuit on a substrate; and forming a planarization film on the drive circuit. The method further includes the steps of: forming a lower electrode on the planarization film; forming a device separation film on the lower electrode; forming an organic compound layer including a light emission layer on the device separation film; and forming an upper electrode on the organic compound layer.

In the production method of the present invention, the following procedure is preferably adopted: the polyimide precursor film is irradiated with light having a predetermined pattern, a development treatment with a chemical solution containing water and/or washing with a cleaning fluid containing water are/is performed so that an opening is formed, and then post-baking is performed.

Figure 4:
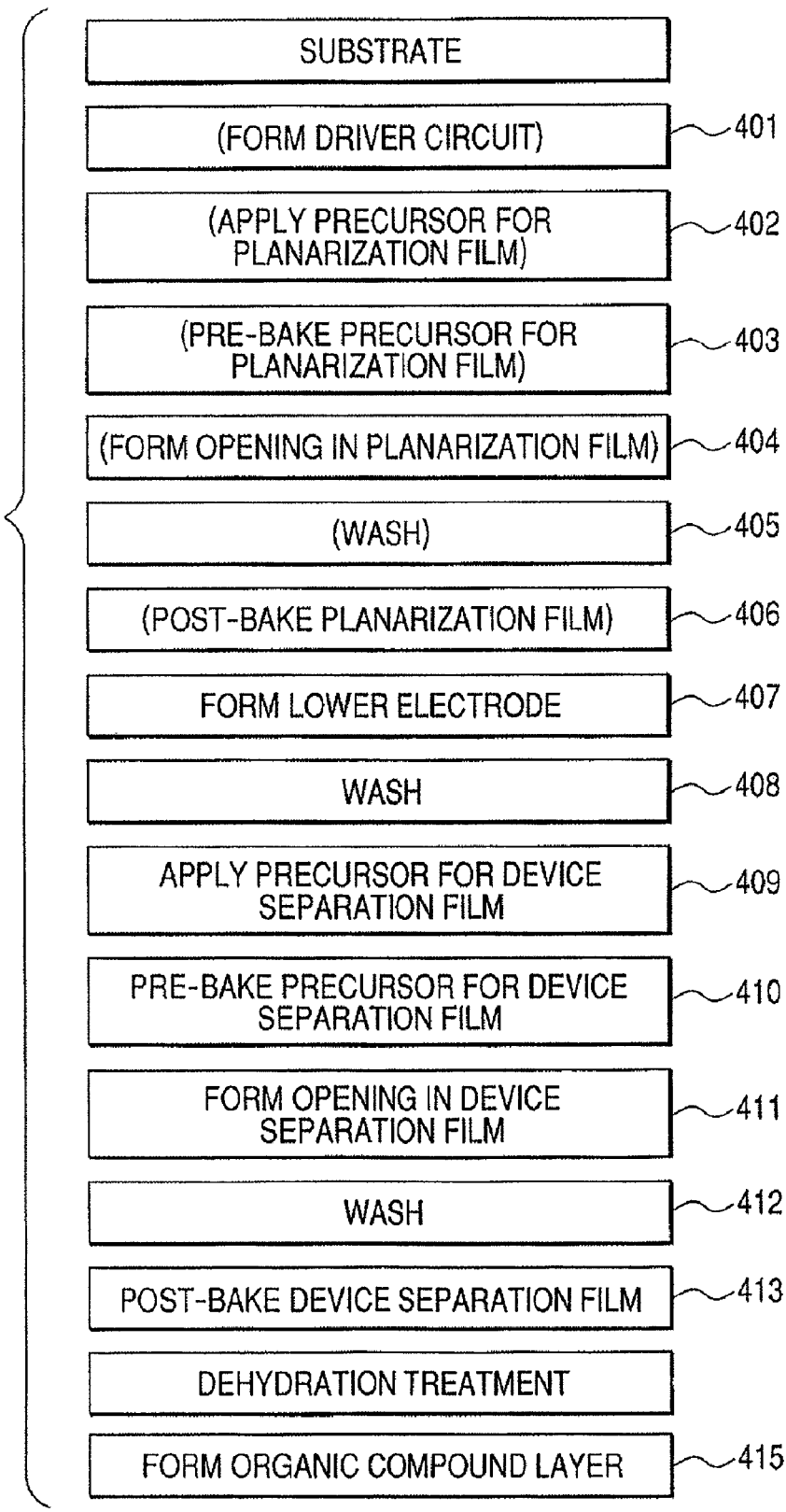
FIG. 4 is a flow chart showing part of a production step for an organic EL display.

FIG. 4 shows the first half of a step for producing an active matrix type organic EL display. In FIG. 4, steps of 401 to 406 each in parentheses are inherent in an active matrix type, and steps subsequent to them are common to a simple matrix type.

First, a circuit as shown in FIG. 2 composed of a transistor, a capacitor, and the like is formed on the surface of a substrate. To this end, the semiconductor layer 301 is deposited, a predetermined pattern is formed, and laser annealing for crystallizing the semiconductor layer 301 or doping for controlling conductivity is performed as required. In addition, the first metal layer 302, the insulating layer 303, and the second metal layer 304 are deposited, and a desired pattern is formed. The foregoing step is collectively shown as FORM DRIVER CIRCUIT (401).

A liquid precursor for a planarization film is applied by means of a method such as spin coating or dipping to the surface provided with a large bump owing to the formation of the circuit (402). Since the surface of the precursor is planarized depending on the viscosity of the precursor, the precursor is pre-baked at a relatively low temperature for curing (403). In this state, a resist is applied to the surface, the resultant is subjected to exposure and development, and an exposed portion or an unexposed portion is removed depending on the nature of the resist. Next, etching is initiated from a portion where the precursor is exposed, whereby an opening is formed in a planarization film. The foregoing step is referred to as FORM OPENING IN PLANARIZATION FILM (404). For simplifying the step, the precursor for a planarization film itself may be provided with photosensitivity, and an opening may be formed by directly subjecting the precursor for a planarization film to exposure and development. The planarization film 308 in which the opening has been formed by means of one of those methods is additionally washed with pure water or the like (405), and a developer and a residue are removed. After that, the resultant is post-baked at a relatively high temperature (406), whereby a reaction is completed.

Next, a metal layer and a transparent conductive layer are deposited, and the resultant is subjected to exposure and development so that a desired pattern is formed. Thus, the lower electrode 309 is formed (407). After that, washing is performed for removing a developer and a residue (408).

Furthermore, a liquid precursor for a device separation film is applied by means of a method such as spin coating or dipping (409). Then, the precursor is pre-baked at a relatively low temperature (410). Then, a resist is applied and pre-baked, and the resultant is subjected to pattern exposure and development, followed by etching of a device separation film. Alternatively, a precursor for a device separation film having photosensitivity is pre-baked, and the resultant is directly subjected to pattern exposure and development. Thus, an opening is formed in the device separation film 310 (411). Next, washing is performed for removing a developer and a residue (412), and the resultant is post-baked at a relatively high temperature (413), whereby the device separation film 310 having the opening is formed.

After that, the organic compound layer 311 composed of the hole transport layer 312, the light emission layer 313, the electron transport layer 314, and the like is formed in an opening portion (415). When a material for the organic compound layer is a low-molecular weight material, vacuum deposition is often adopted. When the material is a polymer material, the material is often applied by means of ink jet, printing, or the like.

In the present invention, a polyimide precursor solution mainly composed of a polyamic acid is used as the precursor for a planarization film and/or the precursor for a device separation film. A rate of temperature increase up to a pre-baking maximum ultimate temperature (Rpre) is 8° C./min or less, or preferably 4° C./min or less. In addition, a post-baking maximum ultimate temperature is in the range of the glass transition temperature (Tglass) of a polyimide film or more to less than Tglass+40° C., or preferably Tglass+10° C. or more to less than Tglass+30° C.

A polyimide precursor solution having a viscosity of 15 mPa·s or less is preferably used for securing the flatness of a planarization film. A solution having a low viscosity like this often contains a solvent at a high concentration, so the present invention can be particularly suitably applied for uniformly advancing imidation in the thickness direction of the film.

It should be noted that a polyamic acid and any other kinds of polymers may be used as a mixture for the purpose of, for example, adjusting the flatness of the planarization film or adjusting the shape of the opening of the device separation film.

EXAMPLE 1

A simple matrix type organic EL display having the constitution shown in FIGS. 1A and 1B and capable of displaying a full color was prototyped.

First, an ITO film having a thickness of 400 nm was deposited onto the surface of the no-alkali glass substrate 100 measuring 100 mm long by 100 mm wide by 1.1 mm thick by means of a sputtering method. Then, the resultant was patterned with stripes each having a width of 100 μm at a pitch of 125 μm by means of a photolithography method, whereby the lower electrodes 101 were formed. Upon the formation of the device separation film 104 and the organic compound layers 102 in the subsequent steps, a pattern and a mask were designed in such a manner that these films would not lie on the end portions of the stripes of the lower electrodes 101 after the completion of the steps.

A solution of a precursor (polyamic acid) for a non-photosensitive polyimide ("PIX-3400", manufactured by Hitachi Chemical Co., Ltd.) was applied by means of spin coating to the surface of the substrate on which the lower electrodes 101 had been formed to have a thickness of 2 μm. The substrate was mounted on a hot plate capable of accurately controlling its surface temperature, and was heated up to 110° C. at Rpre=8° C./min. The substrate was held at the temperature for 2 minutes, thus pre-baking was finished. Thus, a polyimide precursor film was formed. A resist ("OFPR-800" manufactured by TOKYO OHKA KOGYO CO., LTD.) was applied onto the film by using a spin coater, and the resultant was pre-baked at 110° C. for 7 minutes in such a manner that a resist layer would be formed, followed by g-line exposure. The resultant was developed with an aqueous solution of an organic alkali TMAH having a concentration of 2.38%, whereby an opening measuring 80 μm×240 μm was formed in the resist layer. Then, the resultant was washed with pure water, and the resist film was post-baked at 110° C. Next, the polyimide precursor film that had been pre-baked was etched with an aqueous solution of TMAH having a concentration of 2.38% through the opening of the resist, whereby the openings 105 were formed. After that, the resist was removed by using a remover. After that, the resultant was washed with pure water while being stirred for removing a developer and the remover. After that, the polyimide precursor film in which its openings had been formed was post-baked at Tpost=300° C. for 30 minutes, whereby the system separation film 104 was formed. The substrate was heated in dry air to 80° C., and was then placed in an atmosphere with a pressure reduced to 10 Pa for 30 minutes, followed by a dehydration treatment. The polyimide film of which the device separation film 104 was formed had Tglass of 296° C.

After the dehydration treatment, the substrate was transferred into a vacuum deposition system. After the pressure in the device had been reduced to $2 \times 10^{-4}$ Pa, copper phthalocyanine having a thickness of 15 nm and bis(N-ethylcarbazole) having a thickness of 60 nm were deposited from the vapor, whereby a hole transport layer (not shown) was formed. Next, the substrate was covered with a first metal mask without being exposed to the atmosphere, and 4,4'-bis (2,2'-diphenylvinyl)diphenyl (DPVBi) having a thickness of 20 nm was deposited from the vapor every three stripes to serve as a blue light emission layer (not shown). Next, the substrate was covered with a second metal mask without being exposed to the atmosphere. Then, $Alq_3$ doped with 0.3 wt % of 1,3,5,7,8-pentamethyl-4,4-difluoro-4-bora-3a,4a-diaza-s-indacene (PM546) and having a thickness of 21 nm was deposited from the vapor every three stripes to serve as a green light emission layer (not shown) (each green light emission layer was shifted from its adjacent blue light emission layer by one stripe). Furthermore, the substrate was covered with a third metal mask without being exposed to the atmosphere. Furthermore, $Alq_3$ doped with 1 wt % of 4-(dicyanomethylene)-2-methyl-6-(julolidylstyryl)pyrane (DCJT) and having a thickness of 15 nm was deposited from the vapor every three stripes to serve as a red light emission layer (each red light emission layer was shifted from its adjacent green light emission layer by one stripe). Thus, the blue, green, and red light emission layers were periodically arranged. Next, the third metal mask was removed without the substrate being exposed to the atmosphere, and DPVBi having a thickness of 35 nm and $Alq_3$ having a thickness of 10 nm were vapor-deposited to serve as an electron transport layer (not shown). Finally, the surface of the resultant was doped by being exposed to lithium steam, whereby each organic compound layer 102 composed of the hole transport layer, the light emission layer, and the electron transport layer was formed.

Subsequently, a metal mask having a stripe-shaped opening was brought into contact with the surface of the substrate without the substrate being exposed to the atmosphere, and then aluminum having a thickness of 400 nm was vapor-deposited. Thus, each upper electrode 103 extending in the direction perpendicular to each lower electrode was formed. Furthermore, each lower electrode 101 was connected to a column drive circuit (not shown), and each upper electrode 103 was connected to a row drive circuit (not shown). After that, the entire surface of the substrate was covered with an aluminum cap (not shown), and the inside of the resultant was filled with an argon gas having a dew point of −100° C. or lower. Then, a thermosetting epoxy resin was stuck to the periphery of the resultant for sealing. Thus, an organic EL display was produced.

(1) Imidation Ratio of Device Separation Film

A sample having a device separation film produced on the basis of the same step as that described above was prepared. The device separation film was collected from the sample while being observed with a microscope. The film was mounted on a KBr crystal support plate, and the infrared absorption spectrum of the film was measured by using a microscopic infrared spectroscopic analyzer. The imidation ratio of the film was determined from the expression (1) below. Table 2 shows the results.

(2) Light Emission Intensity Ratio

The resultant display was driven at room temperature under a maximum luminance condition for each color, and the light emission intensity of each color was measured. After that, the display was placed in an environmental test tank having a temperature of 85° C. and a relative humidity of 50%, and was stored for 3 months. After the storage, the light emission intensity of each color was measured under a condition identical to that before the storage, and a ratio of the light emission intensity after the storage to an initial light emission intensity was calculated. As a result, each color maintained a light emission intensity ratio of 95% or more. Table 2 shows the results.

COMPARATIVE EXAMPLES 1 AND 2

An organic EL display was produced in the same manner as in Example 1 except that Rpre and Tpost upon formation of a device separation film were changed as shown in Table 2, and evaluated. Table 2 shows the results.

TABLE 2

|  | Example 1 | Comparative Example 1 | Comparative Example 2 |
| --- | --- | --- | --- |
| Rpre (° C./minute) | 8 | 20 | 20 |
| Tpost (° C.) | 300 | 340 | 290 |
| Imidation Ratio (%) | 87 | 95 | 60 |
| Light Emission Intensity Ratio (%) | ≧95 | 70 to 80 | 60 to 75 |

EXAMPLE 2

An active matrix type organic EL display having the sectional constitution shown in FIG. 3 and the circuit constitution shown in FIG. 2 and having a full color display was prototyped.

First, an undercoat layer composed of silicon oxide (not shown) was formed on the surface of the no-alkali glass substrate 300 measuring 100 mm long by 100 mm wide by 1.1 mm thick. After that, amorphous silicon was deposited onto the resultant by means of a plasma CVD method. Then, the resultant was subjected to laser annealing, following by being polysilicon. Furthermore, a region to be used as the drive transistor 305 (202) or as the switching transistor 204 was formed by means of a photolithography method. In addition, the first metal layer 302 was deposited, and the lower electrode of the capacitor 306, the power source line 205, and the signal line 208 were formed by means of a photolithography method. Furthermore, the silicon oxide film 303 serving as a gate insulating film was deposited by means of a plasma CVD method. In this state, the semiconductor layer 301 was doped at a low dose, whereby a channel portion was formed. After the gate electrode of a transistor had been formed on the resultant, a portion of the semiconductor layer 301 except the channel portion was doped at a high dose, whereby the source region and drain region of the transistor were formed. After an opening had been formed in the silicon oxide film 303, the second metal layer 304 was formed, and the upper electrode of the capacitor 306 and the scanning line 307 were formed by means of photolithography. While a circuit was formed within the pixel 200, the scanning circuit 210 and the signal circuit 211 were formed on the periphery of the substrate.

As a result of a series of steps, sharp bumps were formed at various sites of the surface of the resultant. The planarization film 308 was formed on the steps. That is, first, a precursor for a photosensitive acrylic resin ("Optomer PC415G" manufactured by JSR) was applied to the surface by using a spin coater, and the resultant was pre-baked at 90° C. for 2 minutes, followed by exposure. After that, the resultant was developed with an aqueous solution of a developer ("PD523AD"), whereby an opening was formed. After washing with pure water, the resultant was post-baked at 220° C. for 60 minutes, whereby the planarization film 308 having the opening was formed.

A metal reflective layer and IZO were laminated on the resultant, and the lower electrode 309 measuring 100 μm×260 μm was formed by means of photolithography. Furthermore, the device separation film 310 was formed on the surface of the electrode.

That is, a precursor for a photosensitive polyimide resin ("DL-1000", manufactured by Toray Industries, Inc.) (polyamic acid) was applied to the surface by using a spin coater, and the temperature of the resultant was increased to 120° C. at a rate of temperature increase (Rpre) of 4° C./min by using an oven. The temperature was held for 2 minutes, thus pre-baking was finished. After that, the resultant was exposed to an i ray, and was developed with a 2.38% aqueous solution of TMAH, whereby openings were formed. After washing with pure water, the resultant was post-baked at 225° C. (Tpost) for 30 minutes by using an oven, whereby the device separation film 310 having a thickness of 1 μm was formed. Each opening portion had a size measuring 80 μm×240 μm, and remained completely within the lower electrode 309. In addition, the section of each opening formed a taper having an angle of about 30°. The polyimide film of which the device separation film 310 was formed had Tglass of 200° C.

The substrate that had undergone the foregoing formation was transferred into a vacuum deposition system. After the pressure in the device had been reduced to 2×10⁻⁴ Pa, FL03 was deposited from the vapor, whereby the hole transport layer 312 having a thickness of 70 nm was formed. Next, the substrate was covered with a first metal mask without being exposed to the atmosphere, and BAlq added with Perylene as a guest was deposited from the vapor onto an opening portion, whereby the light emission layer 313 emitting blue light and having a thickness of 20 nm was formed. Next, the substrate was covered with a second metal mask without being exposed to the atmosphere. Then, Alq$_3$ added with 1% of Coumarin 6 was vapor-deposited as a guest onto an adjacent opening portion, whereby the light emission layer 313 emitting green light and having a thickness of 20 nm was formed. Next, the substrate was covered with a third metal mask without being exposed to the atmosphere. Furthermore, CBP added with 9% of Ir(piq)$_3$ was deposited as a guest from the vapor onto an adjacent pixel, whereby the light emission layer 313 emitting red light and having a thickness of 20 nm was formed. Next, the third metal mask was removed while the substrate was not exposed to the atmosphere, and Bathophenantroline was deposited from the vapor to serve as the electron transport layer 314 having a thickness of 50 nm. Next, AlLi was deposited from the vapor to serve as an electron injection layer having a thickness of 1 nm (not shown).

The structural formulae of the organic compounds used in this example are shown below.

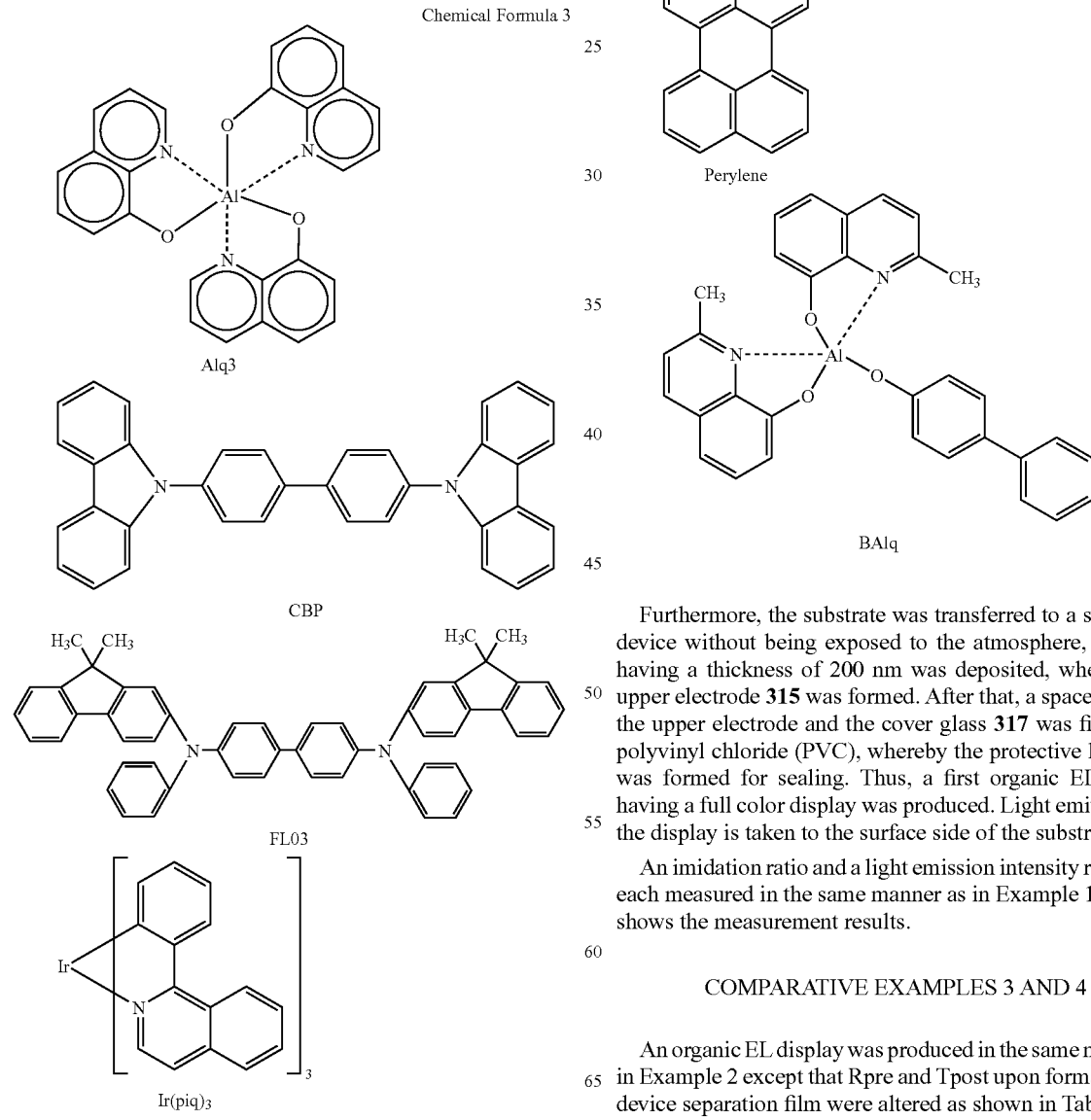

Furthermore, the substrate was transferred to a sputtering device without being exposed to the atmosphere, and ITO having a thickness of 200 nm was deposited, whereby the upper electrode 315 was formed. After that, a space between the upper electrode and the cover glass 317 was filled with polyvinyl chloride (PVC), whereby the protective layer 316 was formed for sealing. Thus, a first organic EL display having a full color display was produced. Light emitted from the display is taken to the surface side of the substrate.

An imidation ratio and a light emission intensity ratio were each measured in the same manner as in Example 1. Table 3 shows the measurement results.

COMPARATIVE EXAMPLES 3 AND 4

An organic EL display was produced in the same manner as in Example 2 except that Rpre and Tpost upon formation of a device separation film were altered as shown in Table 3, and evaluated. Table 3 shows the results.

TABLE 3

|  | Example 2 | Comparative Example 3 | Comparative Example 4 |
|---|---|---|---|
| Rpre (° C./min) | 4 | 30 | 30 |
| Tpost (° C.) | 225 | 250 | 195 |
| Imidation Ratio (%) | 75 | 93 | 62 |
| Light Emission Intensity Ratio (%) | ≧90 | 65 to 80 | 55 to 75 |

This application claims priority from Japanese Patent Application No. 2005-191291 filed on Jun. 30, 2005, which is hereby incorporated by reference herein.

What is claimed is:

1. An organic electroluminescence display comprising:
a lower electrode formed on a substrate;
a device separation film formed on the lower electrode;
an organic compound layer formed on the device separation film and including a light emission layer; and
an upper electrode formed on the organic compound layer,
wherein the device separation film comprises a polyimide film having an imidation ratio in a range of 65% or more to less than 90%.

2. The organic electroluminescence display according to claim 1, wherein:
the device separation film has an opening; and
the organic compound layer is formed to cover the opening of the device separation film.

3. The organic electroluminescence display according to claim 1, wherein the polyimide film comprises a film formed by imidating a polyimide precursor film mainly composed of a polyamic acid.

4. The organic electroluminescence display according to claim 1, wherein the polyimide film has a thickness of 0.5 μm or more.

5. An organic electroluminescence display comprising:
a plurality of organic electroluminescence devices each of which comprises a lower electrode, an organic compound layer including a light emission layer and an upper electrode, and
a device separation film formed between said organic electroluminescence devices,
wherein said device separation film comprises a polyimide film having a imidation ratio in a range of 65% or more to less than 90%.

* * * * *